US007027471B2

(12) United States Patent
Chi et al.

(10) Patent No.: US 7,027,471 B2
(45) Date of Patent: Apr. 11, 2006

(54) FAST WAVELENGTH-TUNABLE LASER SYSTEM USING FABRY-PEROT LASER DIODE

(75) Inventors: Sien Chi, Hsinchu (TW); Chien-Chung Lee, Hualien (TW); Chien-Hung Yeh, Banqiao (TW)

(73) Assignee: National Chiao Tung University, Hsinchu (TW)

( * ) Notice: Subject to any disclaimer, the term of this patent is extended or adjusted under 35 U.S.C. 154(b) by 7 days.

(21) Appl. No.: 10/830,919

(22) Filed: Apr. 23, 2004

(65) Prior Publication Data

US 2005/0180469 A1 Aug. 18, 2005

(30) Foreign Application Priority Data

Feb. 18, 2004 (TW) .............................. 93103854 A

(51) Int. Cl.
*H01S 3/10* (2006.01)

(52) U.S. Cl. .............................. 372/20; 372/6; 372/11

(58) Field of Classification Search .................... 372/6, 372/11, 18, 20, 25, 26

See application file for complete search history.

(56) References Cited

U.S. PATENT DOCUMENTS 5,284,791 A 2/1994 Sakata et al. ................. 372/25
5,933,271 A * 8/1999 Waarts et al. .......... 359/341.31
6,373,867 B1 4/2002 Lin et al. ....................... 372/6
6,393,172 B1 * 5/2002 Brinkman et al. ............ 385/16
6,459,709 B1 10/2002 Lo et al. ....................... 372/18
6,519,060 B1 * 2/2003 Liu ............................ 398/49

OTHER PUBLICATIONS

"Dynamic Responses of Widely Tunable Sampled Grating DBR Lasers" San-Liang Lee, Daniel A. Tauber, Vijay Jayaraman, et al. IEEE Photonics Technology Letters, vol. 8, No. 12, pp. 1597-1599, Dec. 1996.

"Record output power (25mW) across C-band from widely tunable GCSR lasers without additional SOA" Y. Gustafsson, S. Hammerfeldt, J. Hammersberg, et al. Electronics Letters, vol. 39, No. 3, pp. 292-293, Feb. 6, 2003.

"Widely tunable continuous-wave InGaAsP/InP sampled grating lasers" v. Jayaraman, M.E. Heimbuch, L.A. Coldren and S.P. DenBaars Electronics Letters, vol. 30, No. 18, pp. 1492-1494.

* cited by examiner

*Primary Examiner*—Tuyet Vo
*Assistant Examiner*—Jimmy Vu
(74) *Attorney, Agent, or Firm*—Bucknam and Archer

(57) ABSTRACT

The invention relates to a laser system using a multi-longitudinal-mode Fabry-Perot laser diode as an inter-injection light source and a gain cavity formed by other laser diodes of such type so as to achieve the function of fast wavelength switching, so that it is possible to achieve repetitively fast switching of wavelength by varying and controlling the bias voltage of maximum optical gain in said inter-injection type multi-longitudinal-mode Fabry-Perot laser diode so as to achieve three different wavelengths with tuning range of 3.5 nm for a side-mode suppression ratio (SMSR) greater than 19 dB and a response time of wavelength switching in the order of nanosecond.

2 Claims, 7 Drawing Sheets

FAST WAVELENGTH-TUNABLE LASER SYSTEM USING FABRY-PEROT LASER DIODE

BACKGROUND

1. Field of the Invention

The present invention relates to a fast wavelength-tunable laser system, especially to a laser system using a multi-longitudinal-mode Fabry-Perot laser diode as an inter-injection light source and a gain cavity formed by other laser diodes of such type so as to achieve the function of fast wavelength switching.

2. Related Art

Conventionally, a fast wavelength-tunable light source often plays the role of high-speed broadband light source in the applications of wavelength division multiplexing (WDM) system and photonic switching network as well as the application of optical fiber communication.

Currently, there are many efforts made on the research and development of fast wavelength-tunable light source such as U.S. Pat. No. 6,373,867 issued to H. Lin et al. at Apr. 16, 2002 with the title of "Generation of a wavelength-tunable laser oscillation in a wave-guiding gain medium based on passive mode lock" and U.S. Pat. No. 5,284,791 issued to Y. Sakata etal. at Feb. 8, 1994 with the title of "Method of making tunable semiconductor laser". However, in above documents, it is necessary to design a complicate structure in accordance with the application due to a limited tuning range resulted from the output of various multi-mode laser diodes.

Generally, a wavelength-division multiplexing (WDM) system refers to an optical communication system capable of transmitting several separate modulated light signals in one single optical fiber due to signals from light source with different center frequency are not overlapped but shifted by appropriate amounts respectively and can be separated by using optical filters. The light source usually used in such system is the Fabry-Perot laser diode making use the principle of Fabry-Perot interference, in which a standing wave is formed from electromagnetic interference between waves reflected by two mirrors of a resonance cavity due to the enhancement occurred on some frequencies while the attenuation occurred on the other frequencies. However, the disadvantage of such laser is the tuning range is constrained to the output of various multi-mode laser diodes so that Fabry-Perot laser diodes with different center wavelengths must be provided to obtain output of different frequency.

Therefore, it is necessary to develop a laser system required only a simple wavelength tuning technique instead of a process related technique to select different Fabry-Perot laser diodes in accordance with different wavelength requirement so as to achieve fast wavelength switching while having the side-mode suppressing ratio and modulation range of a wavelength-division multiplexing (WDM) system is fully compatible to the available gain bandwidth of a fiber amplifier.

SUMMARY OF THE INVENTION

Therefore, in order to overcome the above problems, an object of present invention is to provide a fast wavelength-tunable laser system, in which a inter-injection light source, i.e. a Fabry-Perot laser diode with multi-longitudinal-mode output, and a gain cavity are used so that it is possible to achieve repetitively fast switching of wavelength by varying and controlling the bias voltage of maximum optical gain in said inter-injection type multi-longitudinal-mode Fabry-Perot laser diode.

To achieve the above object, in an aspect of present invention, a fast wavelength-tunable laser system provided in a wavelength-division multiplexing (WDM) network comprises: two or more multi-longitudinal-mode Fabry-Perot laser diodes, one of which is an inter-injection type laser diode capable of injecting light to the other diode(s); an optical coupler for coupling lights emitted from the laser diodes by forming a gain resonance cavity with the laser diodes; an optical circulator with reflective/transmissive structure for transmitting light to the other diode(s) and outputting light generated in the gain resonance cavity; a polarization controller for stabilizing the output energy of light by controlling its polarization state; and an optical tunable filter for removing undesired wavelength and outputting predetermined wavelength by varying the bias voltage of maximum optical gain in the laser diodes.

Further, in above aspect of present invention, the laser system also comprises: an Erbium-doped fiber, with a predetermined length based on the maximum gain of light, connected to the optical circulator for outputting light of predetermined wavelength; an Erbium-doped fiber amplifier for amplifying the output of the Erbium-doped fiber and transmitting the amplified light to an optical-to-electrical converter; and an optical-to-electrical converter for receiving and converting the amplified light into electrical signal for the purpose of monitoring and analysis. As described above, the laser system of present invention can repetitively switch wavelength by varying the bias voltage of the injection light source so as to achieve three different wavelengths with tuning range of 3.5 nm for a side-mode suppression ratio (SMSR) greater than 19 dB and a response time of wavelength switching in the order of nanosecond.

BRIEF DESCRIPTION OF THE DRAWINGS

The above and other objects, features, and advantages of present invention will become more apparent from the -detailed description in conjunction with the following drawings.

DETAILED DESCRIPTION OF THE INVENTION

The present invention provides a fast wavelength-tunable laser system using a multi-longitudinal-mode Fabry-Perot laser diode as an inter-injection light source and a gain cavity formed by other laser diodes of such type so as to achieve the function of fast wavelength tuning, in which the laser system can repetitively switch wavelength by varying the bias voltage of the injection light source. With the system scope of present invention, it is possible to achieve three different wavelengths with tuning range of 3.5 nm for a side-mode suppression ratio (SMSR) greater than 19 dB and a response time of wavelength switching less than the order of sub-nanosecond. In the following context, detail descriptions of several embodiments of the invention are given, where identical elements are denoted with same reference symbols in the system scope of present system, the inventor has proposed and demonstrated a novel wavelength tunable means with simple structure to achieve the object of fast wavelength tuning, wherein different wavelengths can be retrieved from such means by varying the bias current of one Fabry-Perot laser diode selected as an inter-injection light source, while it is not necessary for the maximum optical gain to occur at the center wavelength of the Fabry-Perot laser diode. Thus, it is possible to achieve the maximum optical gain in the multi-longitudinal-mode Fabry-Perot laser diode so as to lock the peak value of certain spectrum as available tuning range. This wavelength tuning technique has the advantages of simple structure, direct tuning function and fast wavelength tuning.

Figure 1:
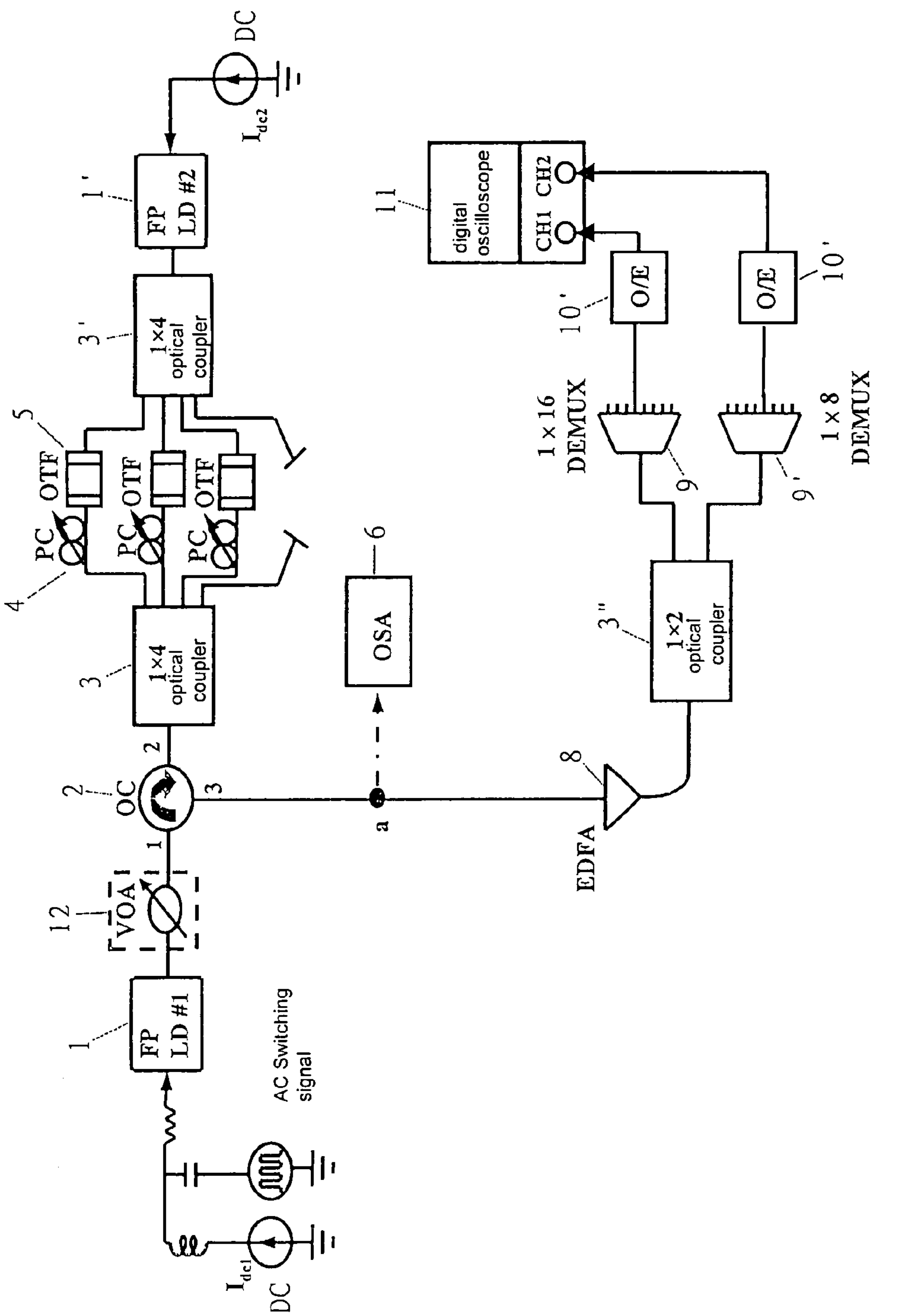
FIG. 1 is a schematic view showing the structure of a fast wavelength-tunable laser system using Fabry-Perot laser diode in accordance with one embodiment of present invention.

FIG. 1 is a schematic view showing the structure of a fast wavelength-tunable laser system using Fabry-Perot laser diode in accordance with the embodiment of present invention, wherein the fast wavelength-tunable laser system comprises: two Fabry-Perot laser diodes 1, 1'; a optical circulator (OC) 2; two 1×4 optical couplers 3, 3'; three polarization controller (PC) 4; and three optical tunable filter (OTF) 5. As shown in FIG. 1, the Fabry-Perot laser diode (LD#1) 1 on the left hand side driven by injected DC current and AC switching signal is used as an inter-injection light source with its output injected into the Fabry-Perot laser diode (LD#2) 1' on the right hand side via the optical circulator 2, three polarization controllers 4 and two 1×4 optical couplers 3, 3'. This all fiber external resonance cavity and active gain medium are composed of said LD#2 1'and two 1×4 optical couplers 3, 3', so that a polarization controller 4 is required to achieve a stable output by controlling the polarization state of said inter-injection light source. The Fabry-Perot laser diodes 1, 1' used here has a wavelength interval of 1.12 nanometers and a bandwidth of 10 nanometers. For Fabry-Perot laser diodes 1, 1' operated at current of 11 miliamperes (mA) and 12 miliamperes respectively, a continuous wave (CW) with center wavelength of 1539.12 nanometers is obtained in an external resonance cavity formed of the multi-longitudinal-mode Fabry-Perot laser diode LD#1 and the other Fabry-Perot laser diode LD#2, wherein such output can be read at point "a" of FIG. 1 by an optical spectrum analyzer (OSA) 6.

In order to measure the response time of wavelength switching, the output of the laser system is transmitted to two wavelength division demultiplexer (DWDM) via a 1×2 optical coupler 3" after passing through an Erbium-doped fiber with predetermined length and an Erbium-doped fiber amplifier, so as to retrieve and convert two wavelengths selected in accordance with the scope of such system into electrical signals by optical-to-electrical converters 10, 10', and then observes the response time of wavelength switching by means of a digital oscilloscope 11 with bandwidth of 20 GHz. The Erbium-doped fiber has a predetermined length based on the achievement of maximum gain of light, while the Erbium-doped fiber amplifier is used to monitor the output power of light emitted from the system by scanning various gain spectrum.

Figure 2:
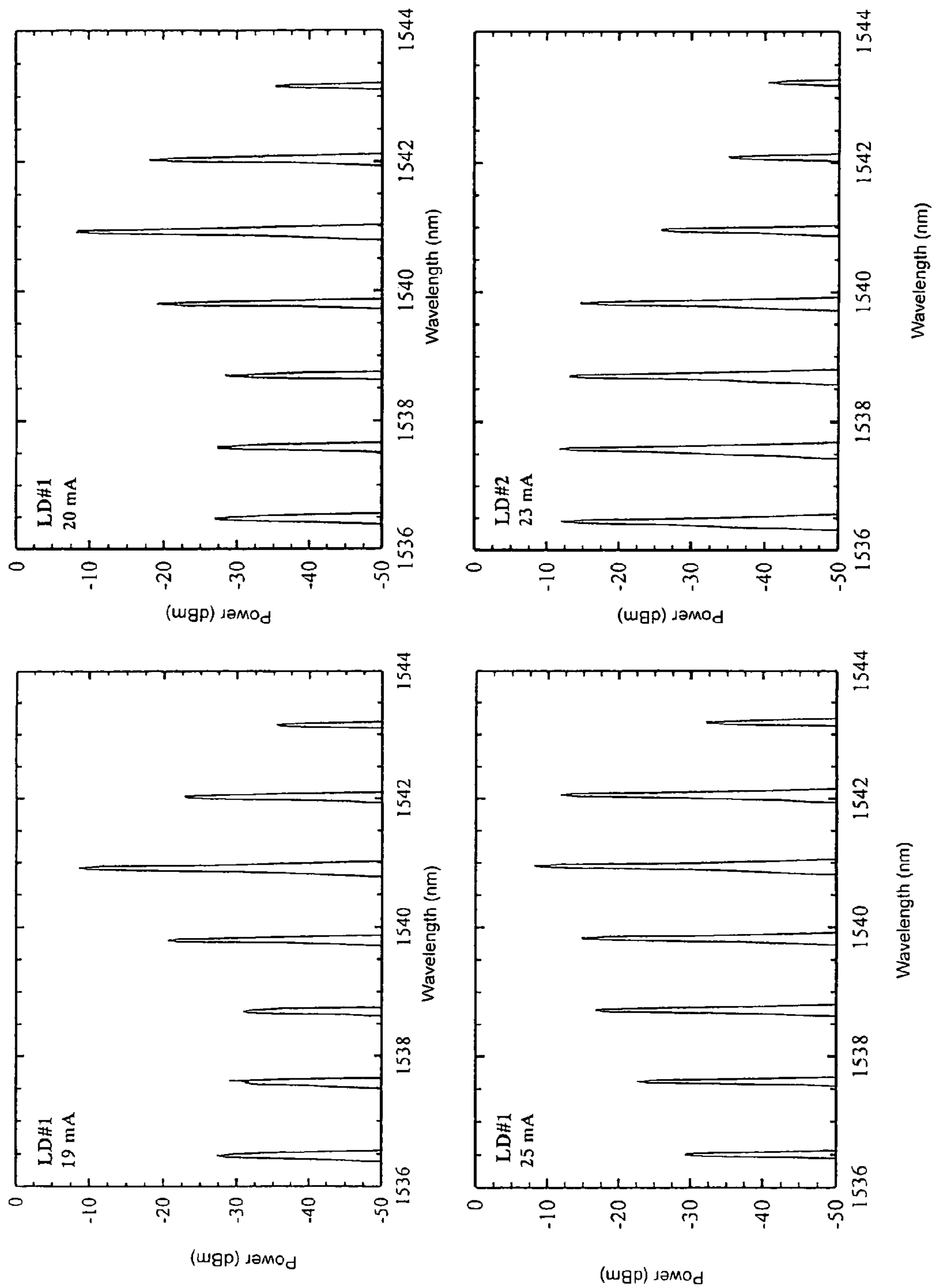
FIG. 2 is a graph showing the optical spectrum of the output of the Fabry-Perot laser diode shown in FIG. 1 under different bias current.
Figure 3:
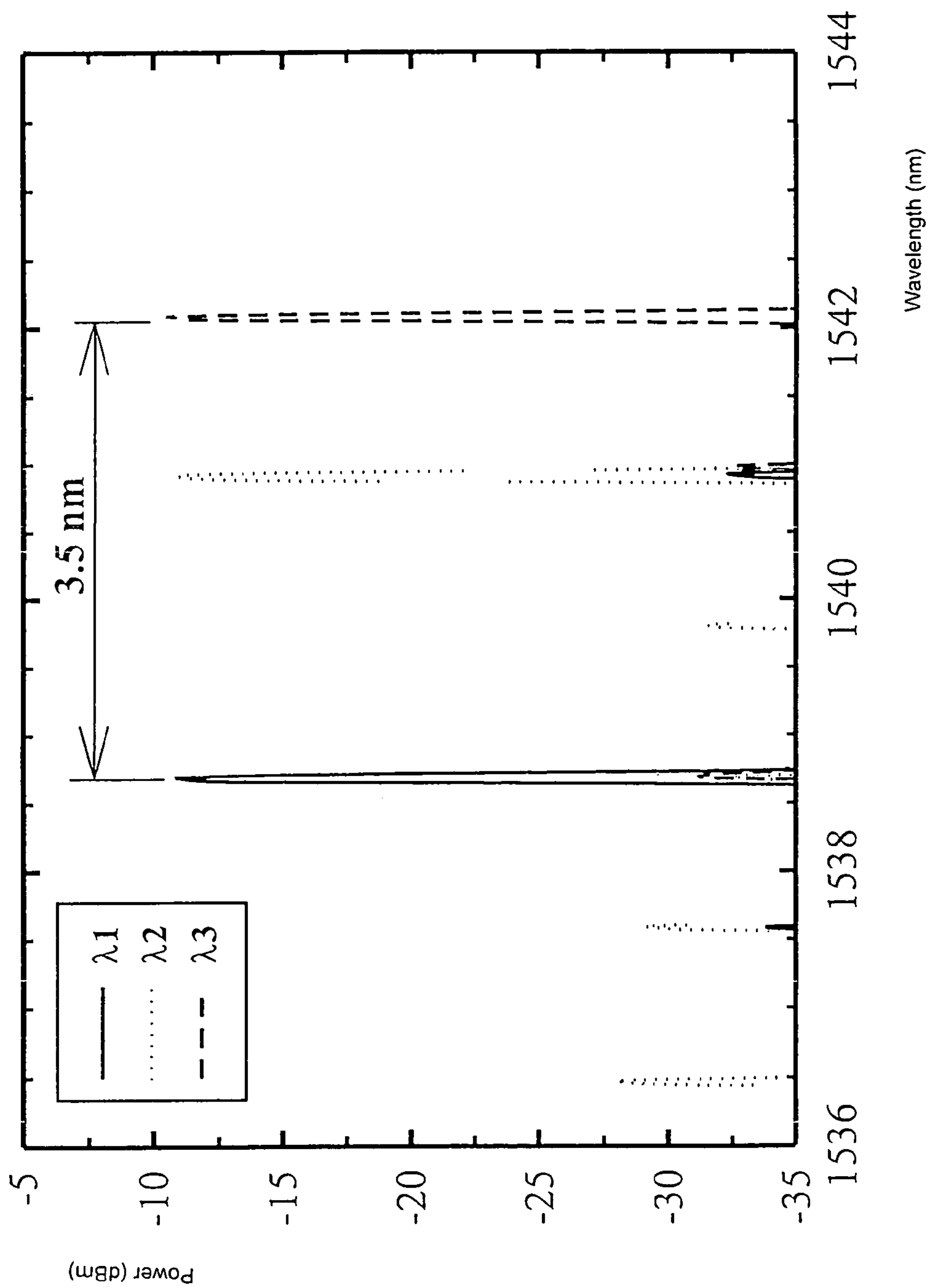
FIG. 3 is a diagram showing the spectrum of three wavelengths retrieved from a laser system with a structure as shown in FIG. 1.

FIG. 2 is a graph showing the optical spectrum of the output of the Fabry-Perot laser diode shown in FIG. 1 under different bias current, wherein three different single-longitudinal-mode wavelength can be obtained by adjusting the bias current of such Fabry-Perot laser diodes 1, 1'. Since these two multi-longitudinal-mode Fabry-Perot laser diodes 1, 1' has a bandwidth of 1.12 nanometers, three spectra of λ1=1538.74 nm, λ2=1541.00 nm and λ3=1542.08 nm can be obtained. As can be seen from FIG. 2, the maximum gain wavelength of the output light is determined by the active gain medium formed by the two Fabry-Perot laser diodes 1, 1' instead of locating at the center wavelength of either Fabry-Perot laser diodes 1, 1'. FIG. 3 is a diagram showing the spectrum of three wavelengths λ1, λ2 and λ3 retrieved from a laser system with a structure as shown in FIG. 1 operated under the bias current of Idc1=19 mA and Idc2=23 mA for λ1, Idc1=20 mA and Idc2=23 mA for λ2 and Idc1=25 mA and Idc2=23 mA for λ3 respectively. The output power of λ1, λ2 and λ3 are −11.11 dBm, −10.9 dBm and −10.85 dBm respectively, while the side-mode suppression ratio is greater than 19 dB for all three wavelengths. With present invention, it is possible to achieve a power variation smaller than 0.2 dB and maintain a stable output of single mode wavelength, that is to say, a system of fast switching can be achieved in the tuning range of 3.5 nm.

Figure 4:
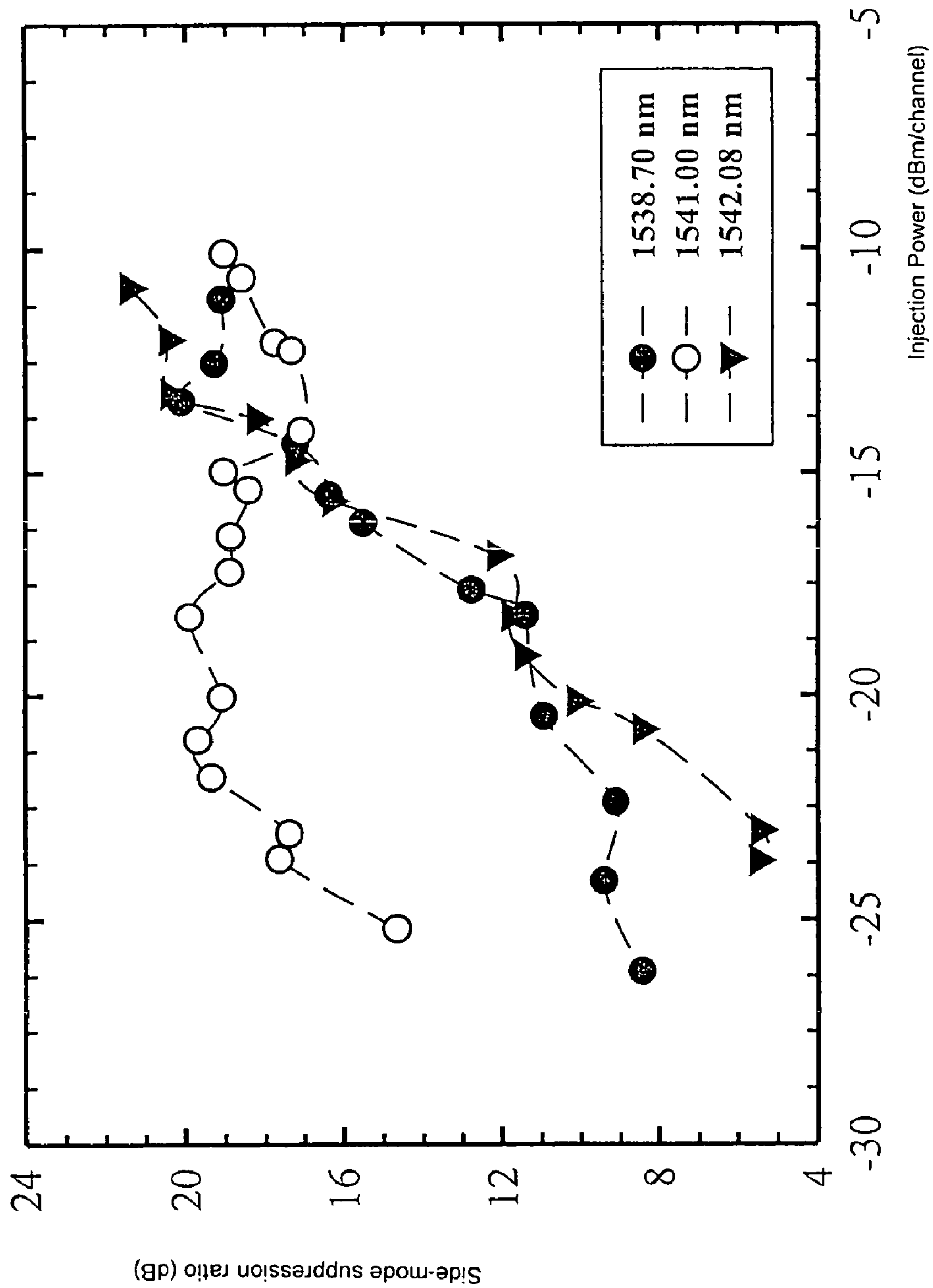
FIG. 4 is a diagram showing the side-mode suppression ratio (SMSR) of a laser system shown in FIG. 1 with respect to the optical power of various inter-injection light sources.

Also, performing an observation on the relationship between the optical power injection and the side mode suppression ratio, that is to say observing the variation of the side mode suppression ratio under the injection of different power for each of the wavelength λ1, λ2 and λ3. In fact, a variable optical attenuator (VOA) 12 is used to attenuate the power of the inter-injection laser diode (LD#1), and to perform the measurement of output power and side mode suppression ratio on the laser system. FIG. 4 is a diagram showing the side-mode suppression ratio (SMSR) of a laser system shown in FIG. 1 with respect to the optical power of various inter-injection light sources for each of the wavelength λ1, λ2 and λ3. It is known from the observation that a lower SMSR value is obtained when a lower power is injected, i.e., a lower power injection can result in the decreasing of the SMSR value. A Fabry-Perot laser diode resonance cavity with an output power above saturation may result in the decay of the SMSR value, while a resonance cavity with output power too low cannot provide stable laser output. It should be understood that in order to have a SMSR value greater than 15 dB for each of the wavelength λ1, λ2 and λ3, a injection power of at least −16.25 dB and more is required in such laser system.

Figure 5:
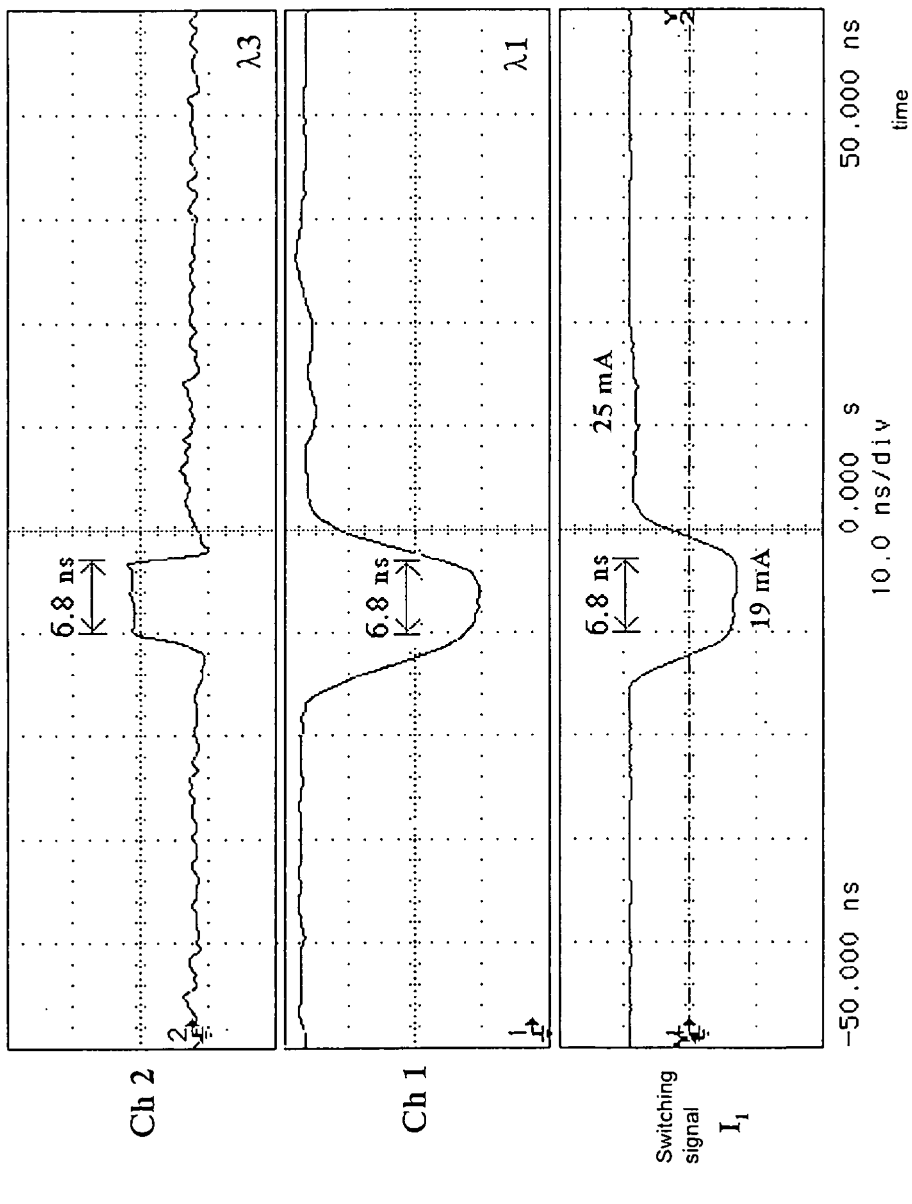
FIG. 5 is a diagram showing the response time of wavelength switching for a laser system shown in FIG. 1.

FIG. 5 is a diagram showing the response time of wavelength switching for a laser system shown in FIG. 1, wherein the system is operated with a square-wave signal of 2.5 MHz and a duty cycle of 97% so as to switch between wavelength λ1 and λ3 by switching bias current of LD#1 between 19 and 25 mA. It can be seen from FIG. 5 that a response time of less than 1 nanosecond is achieved in the wavelength switching.

Figure 6:
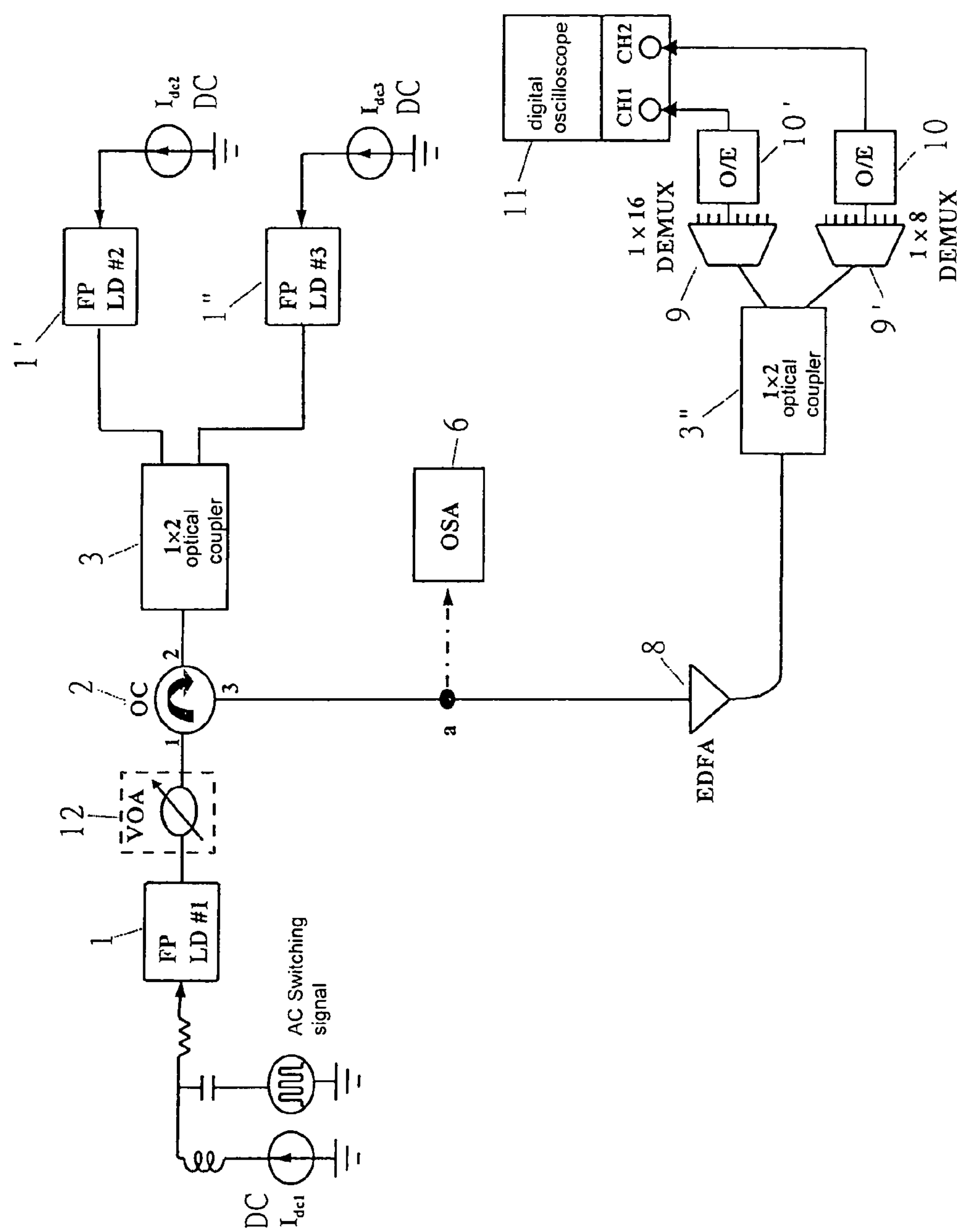
FIG. 6 is a schematic view showing the structure of a fast wavelength-tunable laser system using Fabry-Perot laser diode in accordance with another embodiment of present invention.
Figure 7:
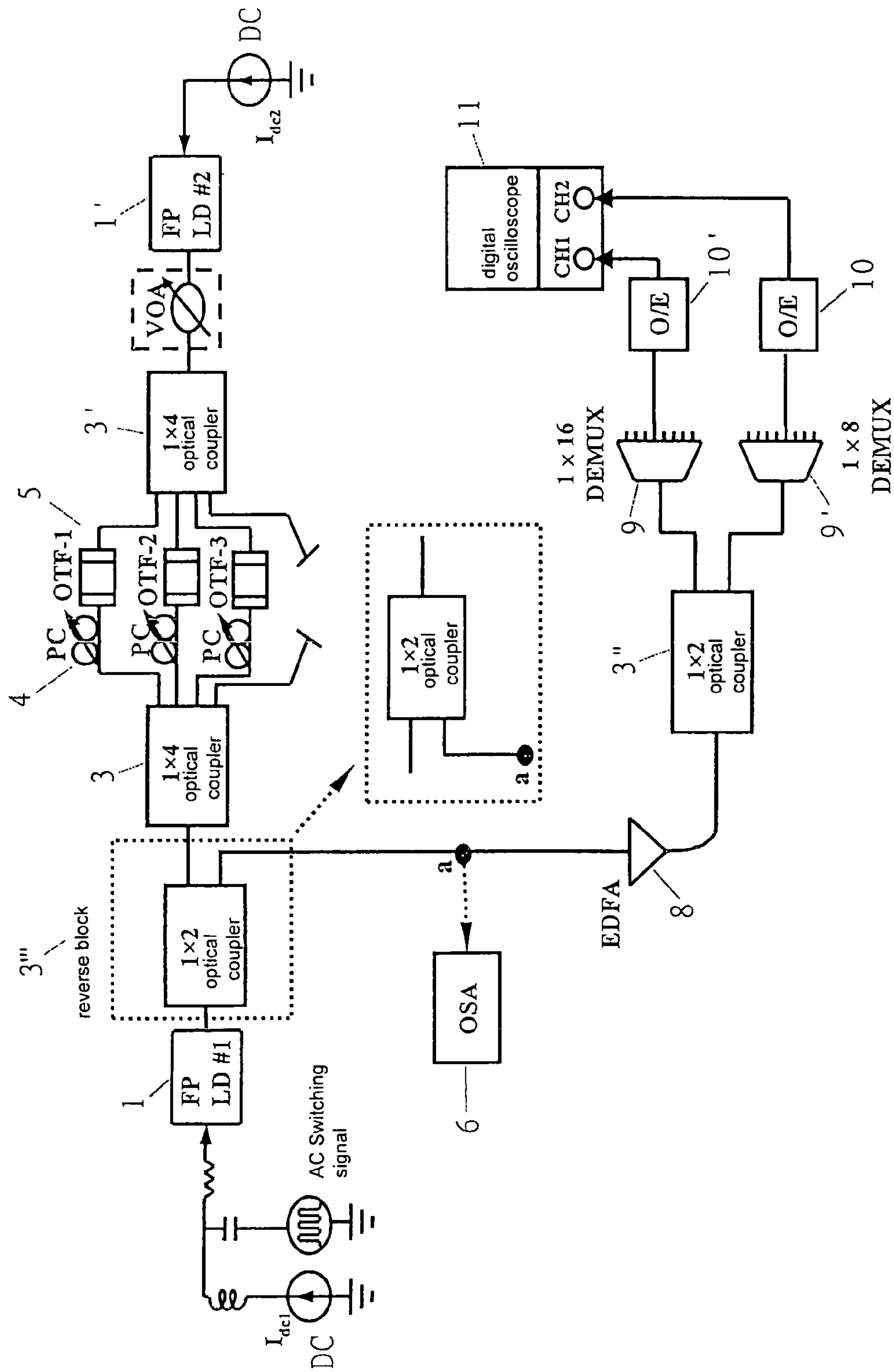
FIG. 7 is a schematic view showing the structure of a fast wavelength-tunable laser system using Fabry-Perot laser diode in accordance with further embodiment of present invention.

FIG. 6 and FIG. 7 are schematic views showing the structure of a fast wavelength-tunable laser system using Fabry-Perot laser diode in accordance with the other embodiments of present invention operated in the same manner as above. As shown in FIG. 6, three Fabry-Perot laser diodes 1, 1', 1" are used to replace the polarization controller and optical filter; and as shown in FIG. 7, equivalent structures are used to replace the optical coupler 3'" in the light circulator shown in FIG. 1.

To summary, it can be understood that the technique of present invention has the advantage of an easily manufactured simple-structure wavelength-tunable laser. Simply by configuring a laser system from low cost Fabry-Perot laser diodes with different center wavelength, a multi-longitudinal-mode fast wavelength-tunable laser source with relative stable power can be directly used as light source in the application of optical communication. Further, the laser system of present invention has the advantages of various wavelength selection, a response time of wavelength switching in the order less than sub-nanosecond, a easy to configure structure and cost effective.

However, above described are preferred embodiments of the invention but not intended to be the limit of the invention, various change and modification must be considered as falling within the appended claims without departing from the scope of the invention.

DESCRIPTION OF SYMBOL

1, 1' fabry-perot laser diode
2 optical circulator
3, 3' optical coupler
4 polarization controller
5 optical tunable filter
6 optical spectrum analyzer
7 erbium-doped fiber
8 erbium-doped fiber amplifier
9, 9' demultiplexer
10, 10' optical-to-electrical converter
11 digital oscilloscope
12 variable optical attenuator

The invention claimed is:

1. A fast wavelength-tunable laser system provided in a wavelength division multiplexing (WDM) network comprising:

two or more multi-longitudinal-mode Fabry-Perot laser diodes, one of which is an inter-injection type laser diode capable of injecting light to the other diode(s);

an optical coupler for coupling lights emitted from said laser diodes by forming a gain resonance cavity with said laser diodes;

an optical circulator with reflective/transmissive structure for transmitting light to the other diode(s) and outputting light generated in said gain resonance cavity;

a polarization controller for stabilizing the output energy of light by controlling its polarization state;

an optical tunable filter for removing undesired wavelength and outputting predetermined wavelength by varying the bias voltage of maximum optical gain in said laser diodes;

an Erbium-doped fiber, with a predetermined length based on the maximum gain of light, connected to said optical circulator for outputting light of predetermined wavelength;

an Erbium-doped fiber amplifier for amplifying the output of said Erbium-doped fiber and transmitting the amplified light to an optical-to-electrical converter; and an optical-to-electrical converter for receiving and converting said amplified light into electrical signal for the purpose of monitoring and analysis.

2. The laser system as set forth in claim 1, wherein said output light contains three different wavelengths in the range of 3.5 nanometers.

* * * * *